(12) United States Patent
Yu et al.

(10) Patent No.: US 11,387,118 B2
(45) Date of Patent: Jul. 12, 2022

(54) INTEGRATED CIRCUIT PACKAGES AND METHODS OF FORMING SAME

(71) Applicant: Taiwan Semiconductor Manufacturing Company, Ltd., Hsinchu (TW)

(72) Inventors: Chen-Hua Yu, Hsinchu (TW); Chien-Hsun Lee, Chu-tung Town (TW); Chi-Yang Yu, Zhongli (TW); Jung Wei Cheng, Hsinchu (TW); Chin-Liang Chen, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/199,766

(22) Filed: Nov. 26, 2018

(65) Prior Publication Data
US 2019/0096698 A1    Mar. 28, 2019

Related U.S. Application Data

(62) Division of application No. 14/470,666, filed on Aug. 27, 2014, now Pat. No. 10,141,201.

(Continued)

(51) Int. Cl.
*H01L 21/56* (2006.01)
*H01L 23/367* (2006.01)
(Continued)

(52) U.S. Cl.
CPC .......... *H01L 21/56* (2013.01); *H01L 21/561* (2013.01); *H01L 23/3107* (2013.01); *H01L 23/3128* (2013.01); *H01L 23/367* (2013.01); *H01L 23/4334* (2013.01); *H01L 23/5389* (2013.01); *H01L 24/14* (2013.01); *H01L 24/17* (2013.01); *H01L 24/19* (2013.01); *H01L 24/20* (2013.01); *H01L 24/97* (2013.01); *H01L 25/0657* (2013.01); *H01L 25/50* (2013.01); *H01L 21/563* (2013.01); *H01L 23/13* (2013.01); *H01L 24/81* (2013.01); *H01L 2224/12105* (2013.01); *H01L 2224/13082* (2013.01); *H01L 2224/13111* (2013.01); *H01L 2224/13124* (2013.01); *H01L 2224/13139* (2013.01);

(Continued)

(58) Field of Classification Search
None
See application file for complete search history.

(56) References Cited

U.S. PATENT DOCUMENTS 5,608,262 A * 3/1997 Degani .................. H01L 23/13
257/723
6,627,998 B1 * 9/2003 Caletka ................. H01L 21/563
257/691

(Continued)

*Primary Examiner* — Shaun M Campbell
*Assistant Examiner* — Aneta B Cieslewicz
(74) *Attorney, Agent, or Firm* — Slater Matsil, LLP

(57) ABSTRACT

Integrated circuit packages and methods of forming the same are disclosed. A first die is mounted on a first side of a workpiece, the workpiece including a second die. The workpiece is mounted to a front side of a package substrate, where the first die is at least partially disposed in a through hole in the package substrate. A heat dissipation feature may be attached on a second side of the workpiece. An encapsulant may be formed on the front side of the package substrate around the workpiece.

20 Claims, 16 Drawing Sheets

Related U.S. Application Data

(60) Provisional application No. 62/012,082, filed on Jun. 13, 2014.

(51) Int. Cl.
    *H01L 23/31*     (2006.01)
    *H01L 23/433*     (2006.01)
    *H01L 23/538*     (2006.01)
    *H01L 23/00*     (2006.01)
    *H01L 25/065*     (2006.01)
    *H01L 25/00*     (2006.01)
    *H01L 23/13*     (2006.01)

(52) U.S. Cl.
CPC ........... *H01L 2224/13144* (2013.01); *H01L 2224/13147* (2013.01); *H01L 2224/13184* (2013.01); *H01L 2224/141* (2013.01); *H01L 2224/1403* (2013.01); *H01L 2224/14051* (2013.01); *H01L 2224/14177* (2013.01); *H01L 2224/16145* (2013.01); *H01L 2224/16225* (2013.01); *H01L 2224/16237* (2013.01); *H01L 2224/1703* (2013.01); *H01L 2224/19* (2013.01); *H01L 2224/32145* (2013.01); *H01L 2224/32225* (2013.01); *H01L 2224/73204* (2013.01); *H01L 2224/73267* (2013.01); *H01L 2224/81005* (2013.01); *H01L 2224/81191* (2013.01); *H01L 2224/81192* (2013.01); *H01L 2224/81815* (2013.01); *H01L 2224/81906* (2013.01); *H01L 2224/83005* (2013.01); *H01L 2224/92125* (2013.01); *H01L 2224/97* (2013.01); *H01L 2225/06513* (2013.01); *H01L 2225/06517* (2013.01); *H01L 2225/06541* (2013.01); *H01L 2225/06555* (2013.01); *H01L 2225/06565* (2013.01); *H01L 2924/10252* (2013.01); *H01L 2924/10253* (2013.01); *H01L 2924/10271* (2013.01); *H01L 2924/10329* (2013.01); *H01L 2924/1431* (2013.01); *H01L 2924/1434* (2013.01); *H01L 2924/15151* (2013.01); *H01L 2924/15311* (2013.01); *H01L 2924/18162* (2013.01); *H01L 2924/3511* (2013.01)

(56) References Cited

U.S. PATENT DOCUMENTS

| | | | |
|---|---|---|---|
| 2002/0192935 A1* | 12/2002 | Joshi | H01L 24/11 438/612 |
| 2006/0138674 A1 | 6/2006 | Huang et al. | |
| 2008/0116589 A1* | 5/2008 | Li | H01L 21/563 257/780 |
| 2008/0315406 A1 | 12/2008 | Chung et al. | |
| 2009/0121335 A1 | 5/2009 | Camacho et al. | |
| 2011/0018114 A1 | 1/2011 | Pagaila et al. | |
| 2011/0031634 A1 | 2/2011 | Pagaila | |
| 2011/0062578 A1 | 3/2011 | Katagiri et al. | |
| 2012/0098123 A1 | 4/2012 | Yu et al. | |
| 2012/0171814 A1* | 7/2012 | Choi | H01L 21/561 438/107 |
| 2012/0228764 A1 | 9/2012 | Tseng et al. | |
| 2015/0235990 A1* | 8/2015 | Cheng | H01L 23/13 257/712 |

\* cited by examiner

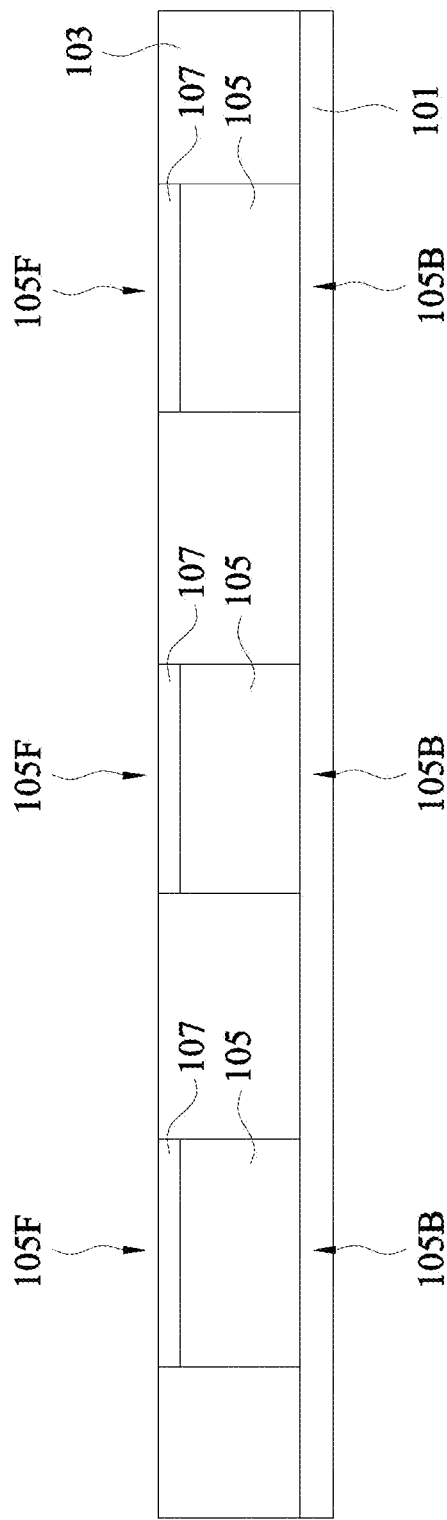
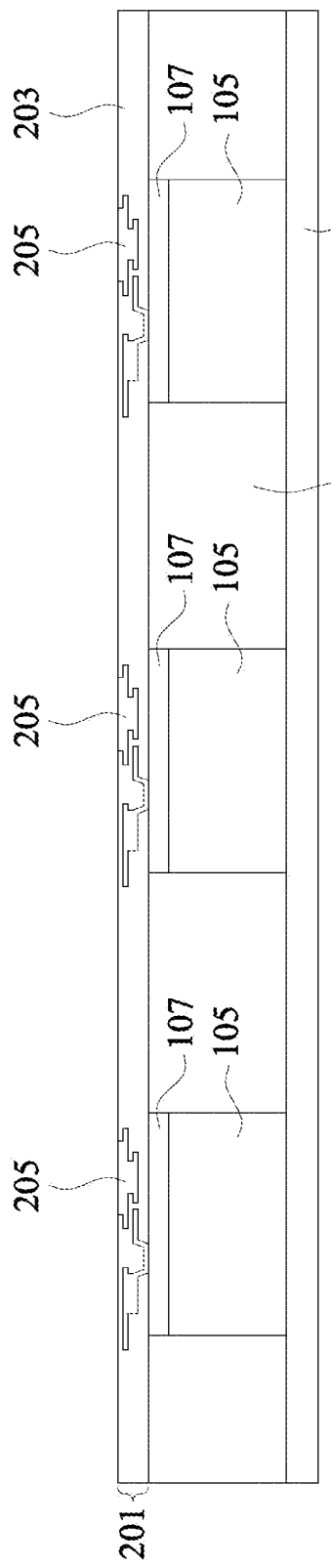
Figure 1
Figure 2

INTEGRATED CIRCUIT PACKAGES AND METHODS OF FORMING SAME

PRIORITY CLAIM AND CROSS-REFERENCE

This application is a divisional of U.S. patent application Ser. No. 14/470,666, filed on Aug. 27, 2014 and entitled "Integrated Circuit Packages and Methods of Forming Same," which claims the benefit of U.S. Provisional Application Ser. No. 62/012,082, filed on Jun. 13, 2014, entitled "Low Warpage Molded Chip on Fan-Out (M-CoFO)," which application are hereby incorporated herein by reference in their entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DICs), have emerged as an effective alternative to further reduce the physical size of a semiconductor device. In a stacked semiconductor device, wafers/dies are stacked on top of one another and are interconnected using through connections such as through vias (TVs). Some of the benefits of 3DICs, for example, include exhibiting a smaller footprint, reducing power consumption by reducing the lengths of signal interconnects, and improving yield and fabrication cost if individual dies are tested separately prior to assembly.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-7 are cross-sectional views of various processing steps during fabrication of an integrated circuit package in accordance with some embodiments.

DETAILED DESCRIPTION

Figure 3:
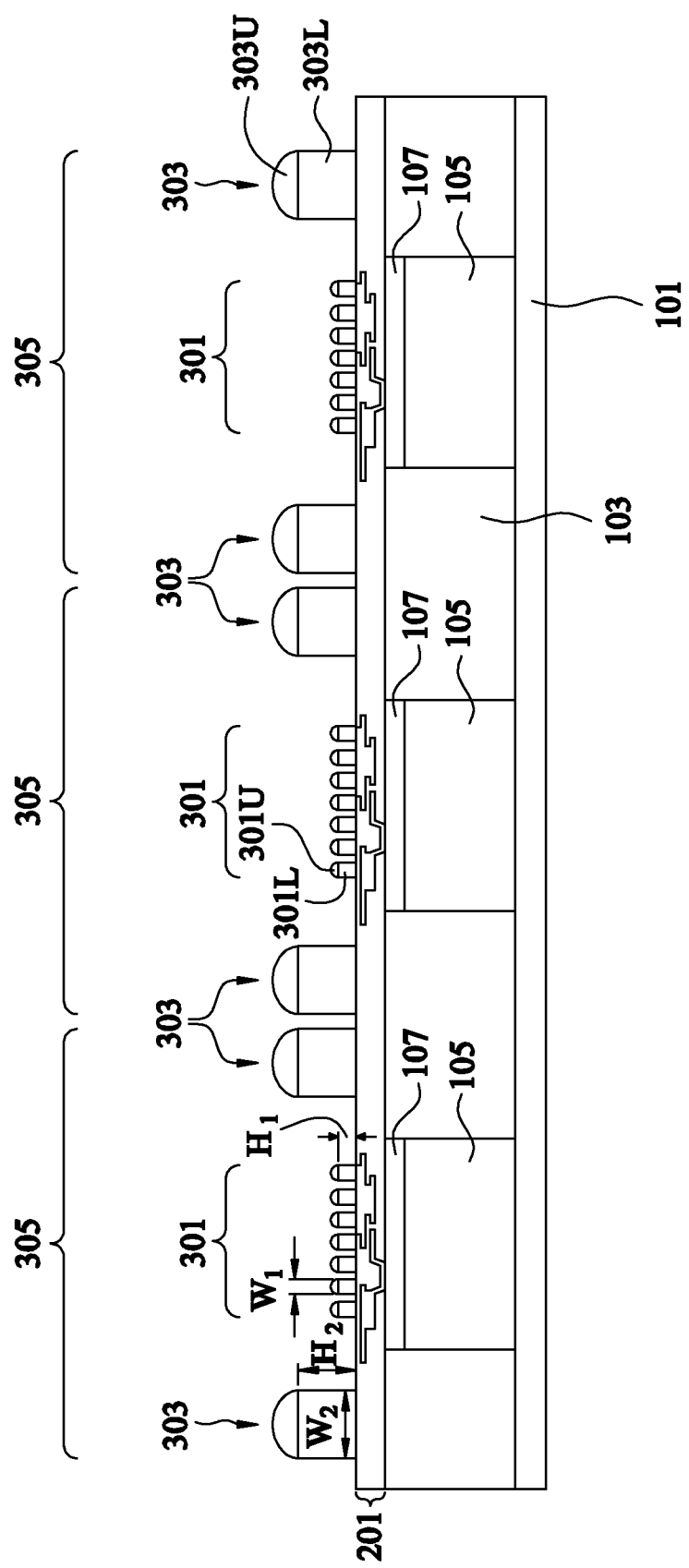

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Structures of integrated circuit packages and methods of forming the same are provided. In particular, integrated circuit packages with heat dissipation features are described in greater detail below. In addition, methods of forming integrated circuit packages with heat dissipation features are also provided below. In what follows, integrated circuit packages will be simply referred to as packages.

Turning now to the illustrated embodiments, FIGS. 1-7 illustrate cross-sectional views of various processing steps during fabrication of an integrated circuit package in accordance with some embodiments. In particular, FIGS. 1-3 illustrate cross-sectional views of various processing steps during fabrication of semiconductor devices such as integrated fan-out (InFO) devices in accordance with some embodiments. FIGS. 4-7 illustrate cross-sectional views of various processing steps during packaging a semiconductor device formed in FIGS. 1-3 in accordance with some embodiments.

FIG. 1 illustrates dies 105 attached to a carrier 101 and encapsulated by a first encapsulant 103. The carrier 101 may be formed of quartz, glass, or the like, and provides mechanical support for subsequent operations. In some embodiments, the dies 105 are attached to the carrier 101 using, for example, a pick and place apparatus. In other embodiments, the dies 105 may be attached to the carrier 101 manually, or using any other suitable method. The dies 105 may be attached to the carrier 101 using one or more adhesive layers (not shown) formed on back sides 105B of the dies 105. The one or more adhesive layers may comprise a die attach film, any suitable adhesive, epoxy, wax, ultraviolet (UV) glue (which loses its adhesive property when exposed to UV radiation), or the like, and may be formed using a deposition process, a spin coating process, a printing process, a lamination process, or the like.

In some embodiments, the dies 105 may be logic dies, memory dies, sensor dies, analog dies, or the like. The dies 105 may be formed using a complementary metal-oxide-semiconductor (CMOS) process, a micro-electro-mechanical systems (MEMS) process, a nano-electro-mechanical systems (NEMS) process, the like, or a combination thereof. In some embodiments, the dies may be formed as part of a wafer. The wafer is singulated by sawing, laser ablation, or the like, to form the individual dies 105. Subsequently, functional testing may be performed on the dies 105. Thus, the dies 105 illustrated in FIG. 1 may include only known good dies (KGDs), which have passed one or more functional quality tests.

The dies 105 may comprise a substrate, various active and passive devices on the substrate, and various metallization layers over the substrate, which are not explicitly illustrated in FIG. 1 as their inclusion is not necessary for understanding various embodiments described below. The substrate may be formed of silicon, although it may also be formed of other group III, group IV, and/or group V elements, such as silicon, germanium, gallium, arsenic, and combinations thereof. The substrate may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like.

In some embodiments, the variety of active and passive devices may include various n-type metal-oxide semiconductor (NMOS) and/or p-type metal-oxide semiconductor (PMOS) devices such as transistors, capacitors, resistors, diodes, photo-diodes, fuses and/or the like.

The metallization layers may include an inter-layer dielectric (ILD)/inter-metal dielectric layers (IMDs) formed over the substrate. The ILD/IMDs may be formed, for example, of a low-K dielectric material, such as phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), and plasma enhanced CVD (PECVD).

In some embodiments, interconnect structures may be formed in the ILD/IMDs using, for example, a damascene process, a dual damascene process, or the like. The ILD/IMDs may be patterned using photolithography techniques to form trenches and vias. The interconnect structures are formed by depositing a suitable conductive material in the trenches and the vias of the ILD/IMDs using various deposition and plating methods, or the like. In addition, the interconnect structures may include one or more barrier/adhesion layers (not shown) to protect the ILD/IMDs from diffusion and metallic poisoning. The one or more barrier/adhesion layers may comprise titanium, titanium nitride, tantalum, tantalum nitride, or other alternatives. The barrier layer may be formed using physical vapor deposition (PVD), atomic layer deposition (ALD), sputtering, or the like. The conductive material of the interconnect structures may comprise copper, a copper alloy, silver, gold, tungsten, tantalum, aluminum, and the like. In an embodiment, the steps for forming the interconnect structures may include blanket forming the one or more barrier/adhesion layers, depositing a thin seed layer of a conductive material, and filling the trenches and the vias in the ILD/IMDs with the conductive material, for example, by plating. A chemical-mechanical polishing (CMP) is then performed to remove excess portions of the interconnect structures. In some embodiments, the interconnect structures may provide electrical connections between the various passive and active devices formed on the substrate.

Referring further to FIG. 1, a contact layer 107 including one or more contact pads (not individually shown) are formed over the metallization layers on a front side 105F of the die 105 and may be electrically coupled to the active devices through various interconnect structures of the metallization layers. In some embodiments, the contact pads may comprise aluminum, although other conductive materials such as copper, tungsten, silver, gold, the like, or a combination thereof may also be used. In some embodiments, the conductive material of the contact pads, such as aluminum, is deposited over the metallization layers and patterned to form the contact pads. The contact pads may be patterned using photolithography techniques. Generally, photolithography techniques involve depositing a photoresist material, which is subsequently irradiated (exposed) and developed to remove a portion of the photoresist material. The remaining photoresist material protects the underlying material, such as the conductive material of the contact pads, from subsequent processing steps, such as etching. A suitable etching process, such as a reactive ion etch (RIE) or other dry etch, an isotropic or anisotropic wet etch, or any other suitable etch or patterning process may be applied to the conductive material of the contact pads to remove the exposed portion of the conductive material and form the contact pads. For example, exposed portions of the conductive material such as aluminum may be etched using a mixture of 80% phosphoric acid, 5% nitric acid, 5% acetic acid, and 10% de-ionized (DI) water. In other embodiments, contact pads comprising copper may be formed using, for example, a damascene process.

In some embodiments, a passivation layer (not shown) is formed over the metallization layers and the contact layer 107 on the front side 105F of the die 105. In some embodiments, the passivation layer may comprise dielectric materials such as polyimide, benzocyclobutene (BCB), polybenzoxazole (PBO), silicon nitride, silicon carbide, silicon oxide, silicon oxynitride, low-k dielectrics such as carbon doped oxides, extremely low-k dielectrics such as porous carbon doped silicon dioxide, the like, or a combination thereof. The passivation layer may be deposited by CVD, PVD, ALD, a spin-on-dielectric process, the like, or a combination thereof.

Referring further to FIG. 1, openings (not shown) may be formed in the passivation layer to expose at least a portion of the contact pads in the contact layer 107. In some embodiments, a photoresist material (not shown) is formed over the passivation layer. The photoresist material is subsequently irradiated (exposed) and developed to remove a portion of the photoresist material. Subsequently, exposed portions of the passivation layer are removed using, for example, a suitable etching process to form the openings. In an embodiment with the passivation layer formed of silicon oxide, the passivation layer is etched using, for example, buffered hydrofluoric acid (HF). In another embodiment with the passivation layer formed of silicon nitride, the passivation layer is etched using, for example, hot phosphoric acid ($H_3PO_4$).

Referring further to FIG. 1, the first encapsulant 103 is formed over the carrier 101 and between neighboring dies 105. In some embodiments, the first encapsulant 103 may comprise a molding compound such as an epoxy, a resin, a moldable polymer, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid capable of being disposed around and between the dies 105.

In some embodiments, portions of the first encapsulant 103 extending over the dies 105 may be removed to expose the contact layer 107 and the contact pads therein. The portions of the first encapsulant 103 may be removed using a CMP, a grinding process, an etch process, or another suitable thinning process.

Referring to FIG. 2, one or more redistribution layers (RDLs) 201 are formed over the dies 105 and the first encapsulant 103. In some embodiments, the RDLs 201 comprise one or more dielectric layers 203 and one or more conductive features 205 disposed within the one or more dielectric layers 203. In the illustrated embodiment, the one or more dielectric layers 203 are may comprise dielectric materials such as polyimide, benzocyclobutene (BCB), polybenzoxazole (PBO), the like, or a combination thereof, and may be formed using a spin-on coating process, or the like. In some embodiments, each of the one or more dielectric layers 203 may be patterned to expose underlying conductive features. For example, a bottommost dielectric layer of the one or more dielectric layers 203 is patterned to expose the underlying contact pads of the contact layer 107. In some embodiment, the one or more dielectric layers 203 comprising photo-patternable materials may be patterned using an acceptable photolithography technique. For example, the bottommost dielectric layer of the one or more dielectric layers 203 is exposed to light and subsequently developed and/or cured.

Referring further to FIG. 2, a first conductive feature (not individually shown) of the one or more conductive features 205 is formed over the bottommost dielectric layer of the one or more dielectric layers 203. The first conductive feature may comprise various lines/traces (running "horizontally" across a top surface of the bottommost dielectric layer) and/or vias (extending "vertically" through the bottommost dielectric layer, and contacting the underlying contact pads in the contact layer 107). In some embodiments, a seed layer (not shown) is deposited over the bottommost dielectric layer. The seed layer may comprise copper, titanium, nickel, gold, manganese, the like, or a combination thereof, and may be formed by ALD, sputtering, PVD process, the like, or a combination thereof. Subsequently, a photoresist material (not shown) is deposited over the seed layer and patterned to define the desired pattern for the first conductive feature. A conductive material, such as copper, tungsten, aluminum, silver, gold, the like, or a combination thereof, and is formed on the seed layer by an electro-chemical plating process, an electroless plating process, ALD, PVD, the like, or a combination thereof. The photoresist material is removed using appropriate photoresist stripping process, such as ashing followed by a wet clean process. Exposed portions of the seed layer over the bottommost dielectric layer are removed using, for example, a wet or dry etch. Referring further to FIG. 2, the process described above is applied to other dielectric layers of the one or more dielectric layers 203 until formation of the RDLs 201 is completed.

Referring to FIG. 3, first connectors 301 and second connectors 303 are formed on a top surface of the RDLs 201. The first connectors 301 and the second connectors 303 provide electrical connections between external devices and the active and passive devices of the dies 105 (via the RDLs 201, the contact pads in the contact layer 107, and the metallization layers of the dies 105). In some embodiments, the first connectors 301 may have first upper portions 301U and first lower portions 301L, and the second connectors 303 may have second upper portions 303U and second lower portions 303L. In some embodiments, the first lower portions 301L, and the second lower portions 303L may comprise conductive materials such as copper, tungsten, aluminum, silver, gold, the like, or a combination thereof, and may be formed using, an electro-chemical plating process, an electroless plating process, ALD, PVD, the like, or a combination thereof. The first upper portions 301U and the second upper portions 303U may comprise solder materials such as lead-based solders such as PbSn compositions, lead-free solders including InSb, tin, silver, and copper ("SAC") compositions, and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free solders also include SnCu compounds, without the use of silver (Ag), and SnAg compounds, without the use of copper (Cu).

In some embodiments, a topmost dielectric layer of the RDLs 201 is patterned to expose first portions and second portions of the one or more conductive features 205. A first patterned mask (not shown) is formed over the topmost dielectric layer of the RDLs 201. In some embodiments, the first patterned mask comprises a photoresist material, or any photo-patternable material. A material of the first patterned mask is deposited, irradiated (exposed) and developed to remove portions of the material and form openings. The first patterned mask masks the second portions of the one or more conductive features 205 while exposes the first portions of the one or more conductive features 205 through the openings in the first patterned mask.

The openings in the first patterned mask are subsequently filled by a conductive material, thereby forming the first lower portion 301L of the first connectors 301. In some embodiments, the openings containing the first lower portions 301L of the first connectors 301 are further filled by solder material to form the first upper portion 301U of the first connectors 301 and complete formation of the first connectors 301. After the first connectors 301 are formed, the first patterned mask is removed. In an embodiment with the first patterned mask comprising a photoresist material, the first patterned mask may be removed using, for example, ashing followed by a wet clean process.

After the first connectors 301 are formed, a second patterned mask (not shown) is formed over the topmost dielectric layer of the RDLs 201. In some embodiments, the second patterned mask comprises a photoresist material, or any photo-patternable material. A material of the second patterned mask is deposited, irradiated (exposed) and developed to remove portions of the material and form openings. The second patterned mask masks the first connectors 301 while exposes the second portions of the one or more conductive features 205 through the openings in the second patterned mask.

The openings are subsequently filled by a conductive material, thereby forming the second lower portions 303L of the second connectors 303. In some embodiments, the openings are further filled by a solder material to form the second upper portions 303U of the second connectors 303 and complete formation of second connectors 303. After the second connectors 303 are formed, the second patterned mask is removed. In an embodiment with the second patterned mask comprising a photoresist material, the second patterned mask may be removed using, for example, ashing followed by a wet clean process. In some embodiments, the first lower portions 301L of the first connectors 301 have a first height $H_1$ between about 3 μm and about 50 μm, and a first width $W_1$ between about 10 μm and about 50 μm, and the second lower portions 303L of the second connectors 303 have a second height $H_2$ between about 5 μm and about 600 μm, and a second width $W_2$ between about 40 μm and about 600 μm.

In some embodiments, a solder re-flow process may be performed to re-flow the solder material of the first upper portions 301U the first connectors 301 and the second upper portions 303U of the second connectors 303. In some embodiments, the formation of the first connectors 301 and the second connectors 303 may further include the formation of under bump metallurgies (UBMs) (not shown) interposed between the first connectors 301 and the first portions of the one or more conductive features 205, and between the second connectors 303 and the second portions of the one or more conductive features 205. In some embodiments, the UBMs may comprise one or more layers of a suitable conductive material.

Furthermore, the first connectors 301 and the second connectors 303 may have different sizes as illustrated in FIG. 3. In some embodiments, the first connectors 301 may be micro-bumps, while the second connectors may be controlled collapse chip connection (C4) bumps. Different sizes of the first connectors 301 and the second connectors 303 allow different devices to be bonded to the dies 105. As described below in greater detail, the first connectors 301 may be used to electrically connect the dies 105 to other dies, and the second connectors 303 may be used to electrically connect the dies 105 to a package substrate, a printed circuit board, an interposer, another die, a wafer, or the like.

In some embodiments, formation of the first connectors 301 and the second connectors 303 completes formation of semiconductor devices 305. In the illustrated embodiment, each semiconductor device 305 comprises the die 105 encapsulated by the first encapsulant 103, and the first connectors 301 and the second connectors 303 corresponding to the die 105 as illustrated in FIG. 3. Subsequently, the semiconductor devices 305 are singulated by sawing, laser ablation, or the like. As described below in greater detail, the semiconductor devices 305 are further processed to form packages. In the illustrated embodiment, each of the semiconductor devices 305 comprises a single die (such as the die 105). In other embodiments, each of the semiconductor devices 305 may comprise any number of dies depending on design specification of the semiconductor devices 305.

Figure 4:
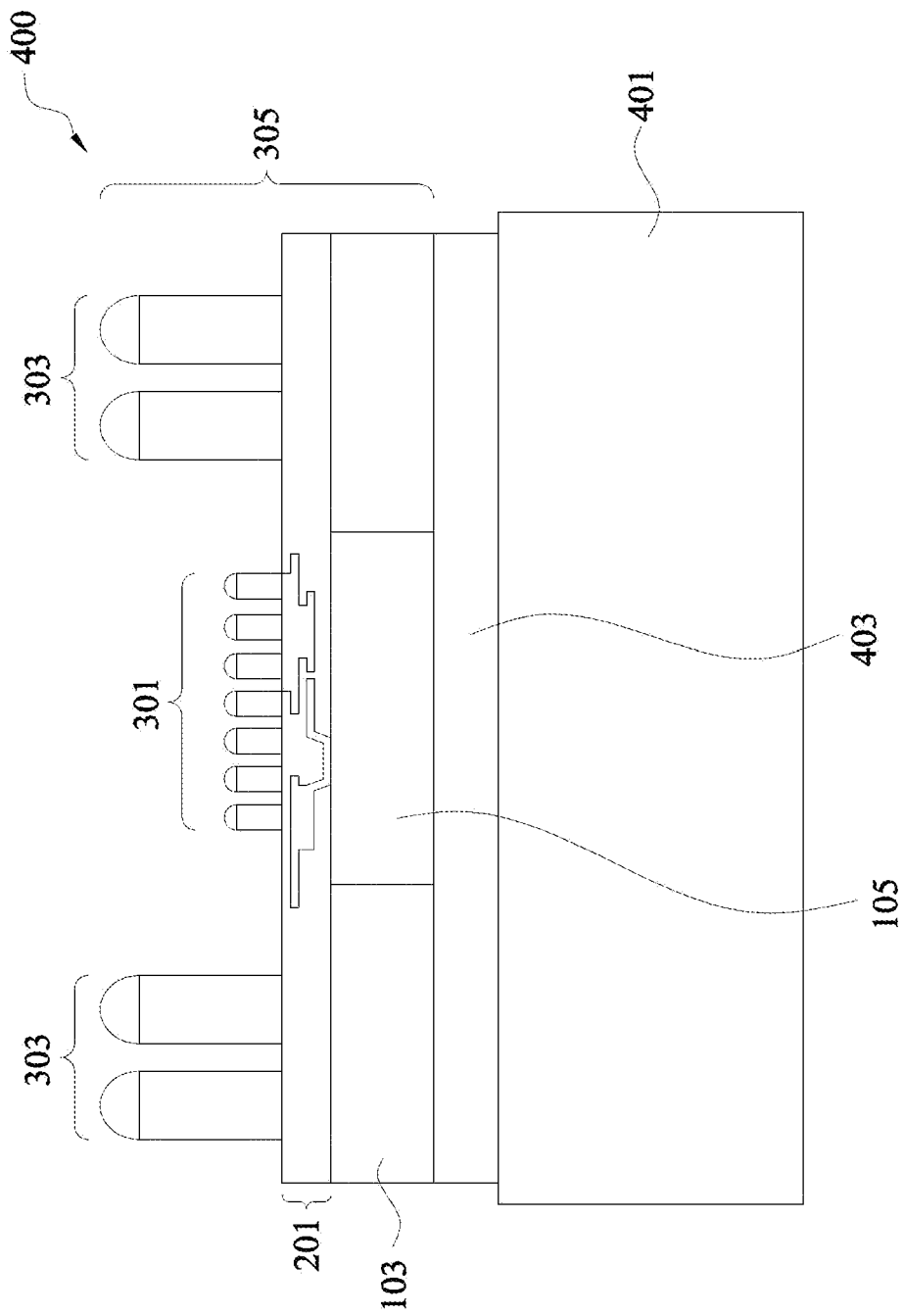

Referring to FIG. 4, the semiconductor device 305 is attached to a heat dissipation feature (HDF) 401 using an interface layer 403. The HDF 401 may be disposed on a back side of the semiconductor device 305 opposite the RDLs 201, first connectors 301, and second connectors 303. The HDF 401 may be a contour lid having a high thermal conductivity, and may be formed using a metal, a metal alloy, or any suitable material having a high thermal conductivity. For example, the HDF 401 may comprise metals and/or metal alloys such as Al, Cu, Ni, Co, combinations thereof, and the like. The HDF 401 may also be formed of a composite material, for example silicon carbide, aluminum nitride, graphite, and the like.

The interface layer 403 may include a thermal interface material (TIM), for example, a polymer having a good thermal conductivity. Because the TIM may have good thermal conductivity, the TIM may be disposed directly between the die 105 of the semiconductor device 305 and the HDF 401. Furthermore, the interface layer 403 may also include an adhesive (e.g., an epoxy, silicon resin, and the like) for affixing the HDF 401 to the semiconductor device 305. The adhesive used may have a better adhering ability and a lower thermal conductivity than a TIM, and as such, the adhesive portions of the interface layer 403 may be disposed over areas having lower thermal dissipation needs (e.g., over surfaces of the first encapsulant 103).

Figure 5:
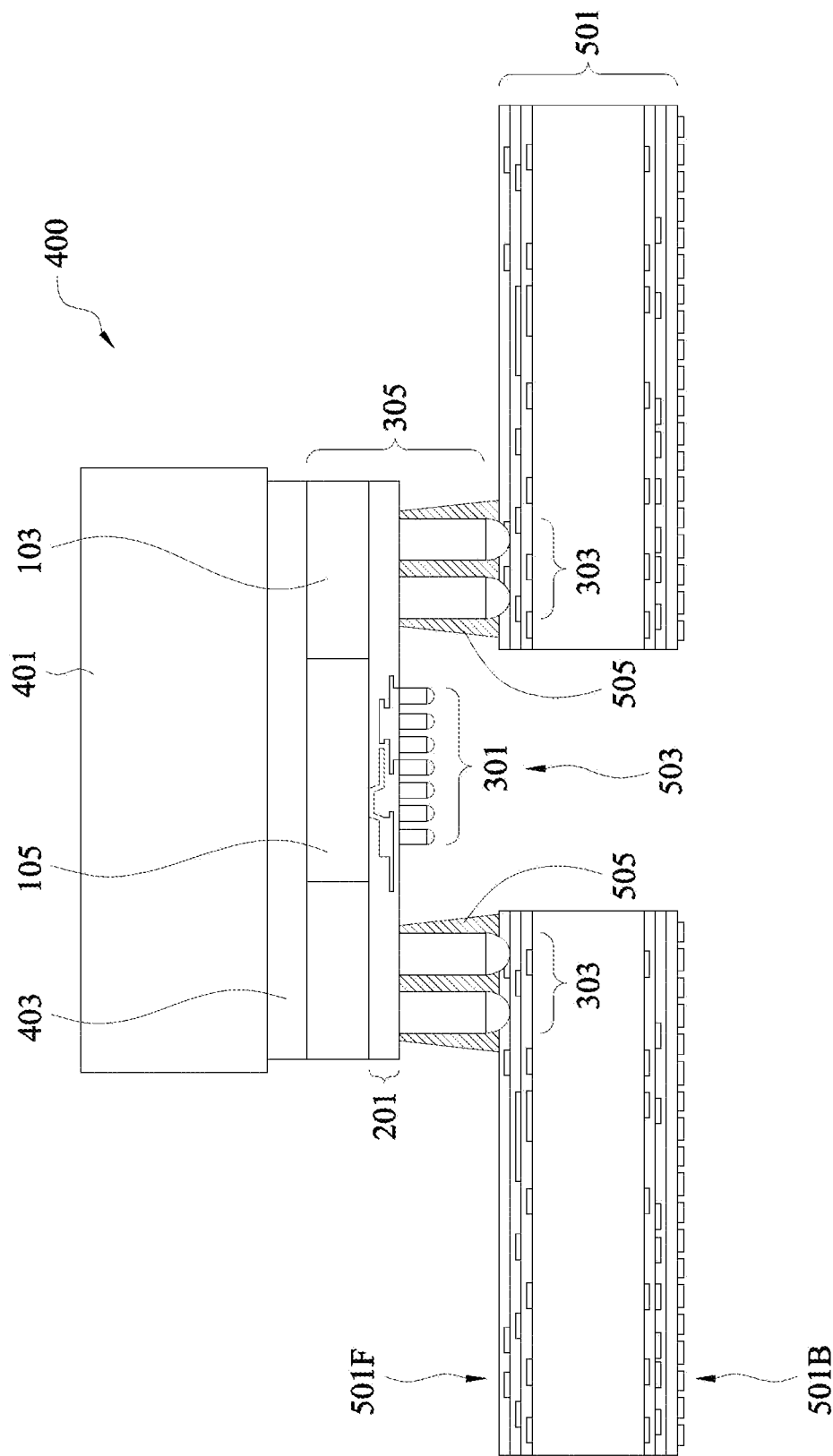

Referring to FIG. 5, the semiconductor device 305 with attached HDF 401 is mounted on a front side 501F of a package substrate 501 using the second connectors 303. A reflow may be performed on the second connectors 303 to bond the semiconductor device 305 with attached HDF 401 to the package substrate 501. Subsequently, a first underfill 505 may be dispensed between the semiconductor device 305 and the package substrate 501 around the second connectors 303. The first underfill 505 may be substantial similar to the first encapsulant 103. In some embodiments, a curing process may be performed after a material of the first underfill 505 is dispensed to harden the material of the first underfill 505.

The package substrate 501 may be a laminated substrate, a silicon interposer, a glass interposer, a printed circuit board (PCB), or the like. For example, the package substrate 501 may include a core and one or more build-up layers disposed on either side of the core. The build-up layers may be etched into traces of various widths and lengths and connected through inter-layer vias. Together, the traces/lines and vias may form an electrical network to route power, ground, and signals from the front side 501F of the package substrate 501 to a back side 501B of the package substrate 501. The package substrate 501 may be fabricated from, for example, silicon, an organic (laminate) material such as bismaleimide-triazine (BT), a polymer-based material such as liquid-crystal polymer (LCP), a ceramic material such as low-temperature co-fired ceramic (LTCC), or the like. The traces/lines and the vias of the package substrate 501 may be formed from any suitable conductive material, such as copper, aluminum, silver, gold, other metals, alloys, combination thereof, and/or the like, and formed by any suitable technique, such as electro-chemical plating (ECP), electro-less plating, other deposition methods such as sputtering, printing, CVD methods, or the like. In some embodiments, the package substrate 501 comprises electrical elements, such as resistors, capacitors, signal redistribution circuitry, combinations of these, or the like. These electrical elements may be active, passive, or a combination thereof. In other embodiments, the package substrate 501 may be formed without a core.

Furthermore, the package substrate 501 may include a through hole 503, which may be formed in the package substrate 501 using an suitable method. For example, the through hole 503 may be formed using a laser drilling process. The configuration of the package substrate 501 may be designed so that interconnect structures (e.g., power, ground, and/or signal layers) may be routed to avoid the through hole 503. Thus, the through hole 503 may not substantially interfere with the functionality of the package substrate 501.

Figure 6:
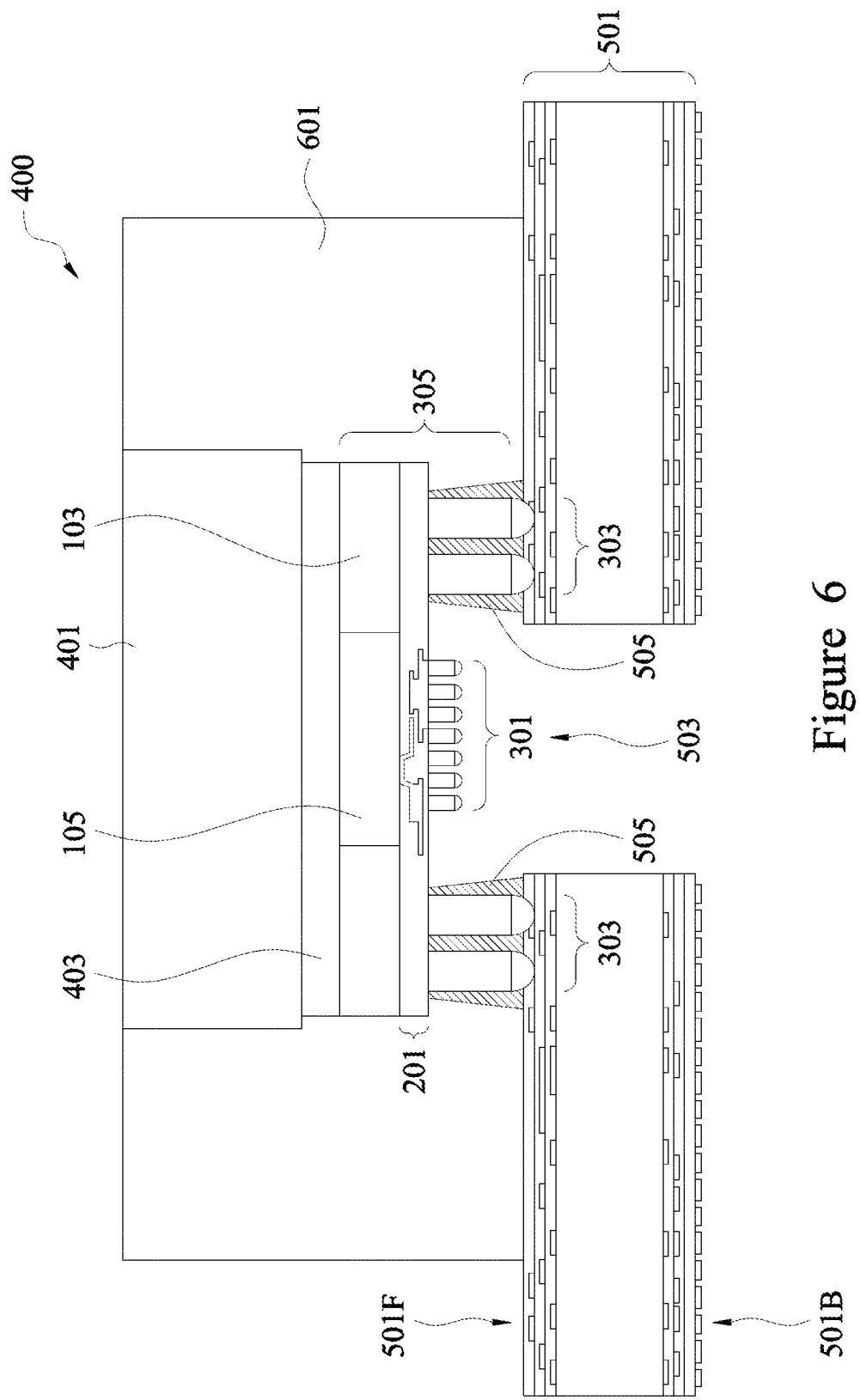

Referring to FIG. 6, a second encapsulant 601 is formed over the package substrate 501 around the semiconductor device 305 and the HDF 401. The second encapsulant 601 may be substantially similar to the first encapsulant 103. In some embodiments, a material of the second encapsulant 601 is dispensed over the package substrate 501 and the HDF 401 around the semiconductor device 305 and cured to harden the material of the second encapsulant 601. In some embodiments, portions of the second encapsulant 601 extending over the HDF 401 may be removed to expose a top surface the HDF 401. The portions of the second encapsulant 601 may be removed using, for example, a CMP process, a grinding process, an etch process, or another suitable thinning process. In the illustrated embodiment, the first underfill 505 prevents the material of the second encapsulant 601 to fill the through hole 503 in the package substrate 501 and the through hole 503 remains open.

Figure 7:
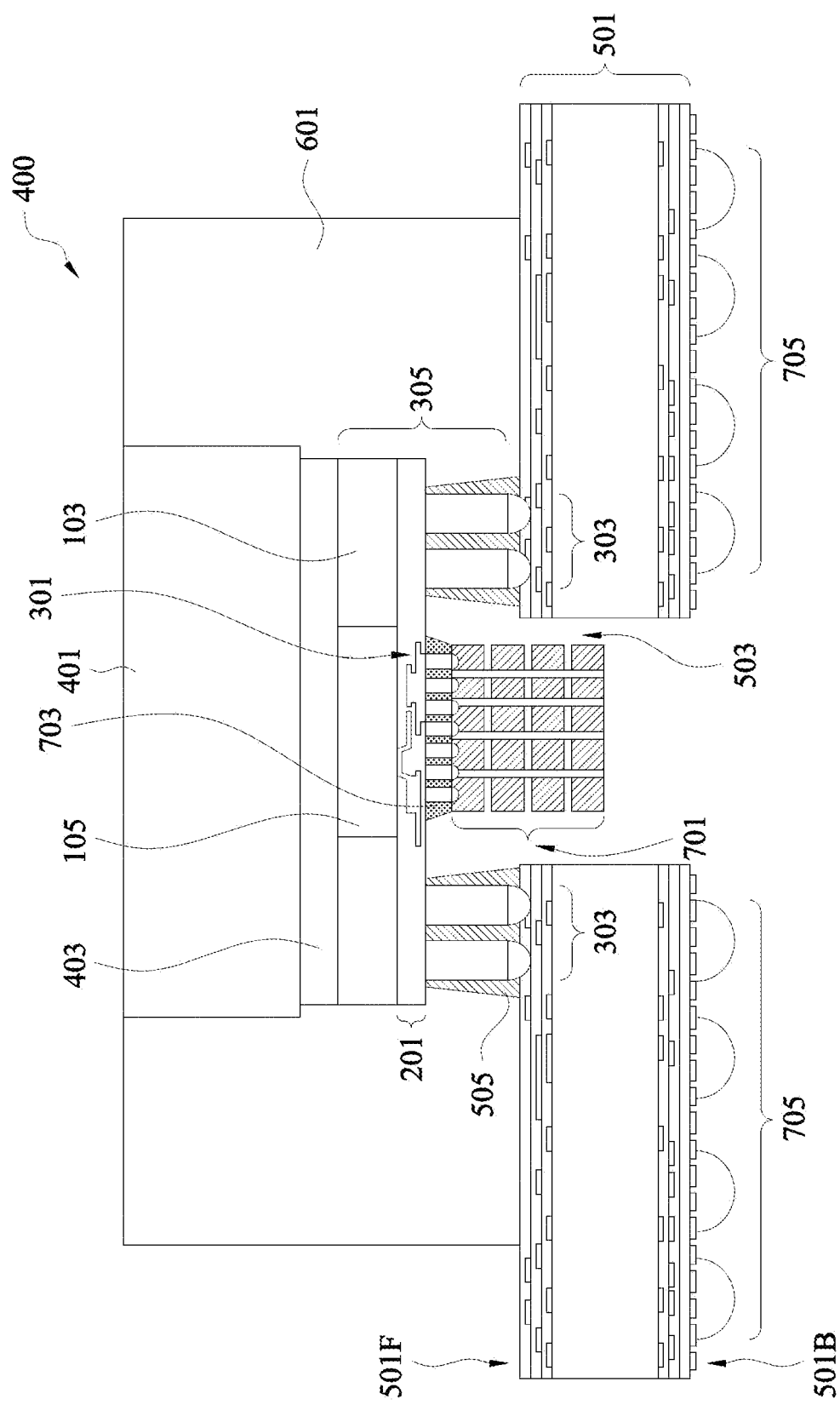

Referring to FIG. 7, a die stack 701 is bonded to the semiconductor device 305 using the first connectors 301. The die stack 701 may comprise one or multiple dies similar to the dies 105. A reflow may be performed on the first connectors 301 to bond the semiconductor device 305 to the die stack 701. Subsequently, the second underfill 703 may be dispensed between the semiconductor device 305 and the die stack 701 around the first connectors 301. After dispensing a material of the second underfill 703, a curing may be also performed to harden the material of the second underfill 703. The second underfill 703 may be substantial similar to the first underfill 505.

In some embodiments, the die stack 701 may be disposed, at least partially, in the through hole 503. Thus, the package 400 may advantageously have a relatively small form factor and higher bandwidth. Furthermore, the die stack 701 may be electrically connected to the package substrate 501 through the RDLs 201, the first connectors 301 and the second connectors 303. Furthermore, by not attaching the HDF 401 to the package substrate 501 directly, warping of the package 400 due to mismatch of the coefficient of thermal expansion between the HDF 401 and the package substrate 501 may be reduced or eliminated. Accordingly, adverse effects (e.g., joint failure between the die stack 701 and the first connectors 301) caused by package warping may be reduced or eliminated. In addition, encapsulating the package 400 by the second encapsulant 601 may further reduce or eliminate the adverse effects caused by package warping.

Referring further to FIG. 7, after bonding the die stack 701 to the package substrate 501, a marking process (e.g., laser marking) may be performed to mark the package 400. Furthermore, in some embodiments, third connectors 705 (e.g., ball grid array (BGA) balls) are formed on the back side 501B of the package substrate 501 to complete formation of the package 400. The BGA balls may be formed of solder materials similar to those of the first connectors 301 and the second connectors 303 described above with reference to FIG. 3. In some embodiments, the third connectors 705 may be used to electrically connect the package 400 to a motherboard (not shown) such as a PCB or another device component of an electrical system.

Figure 8:
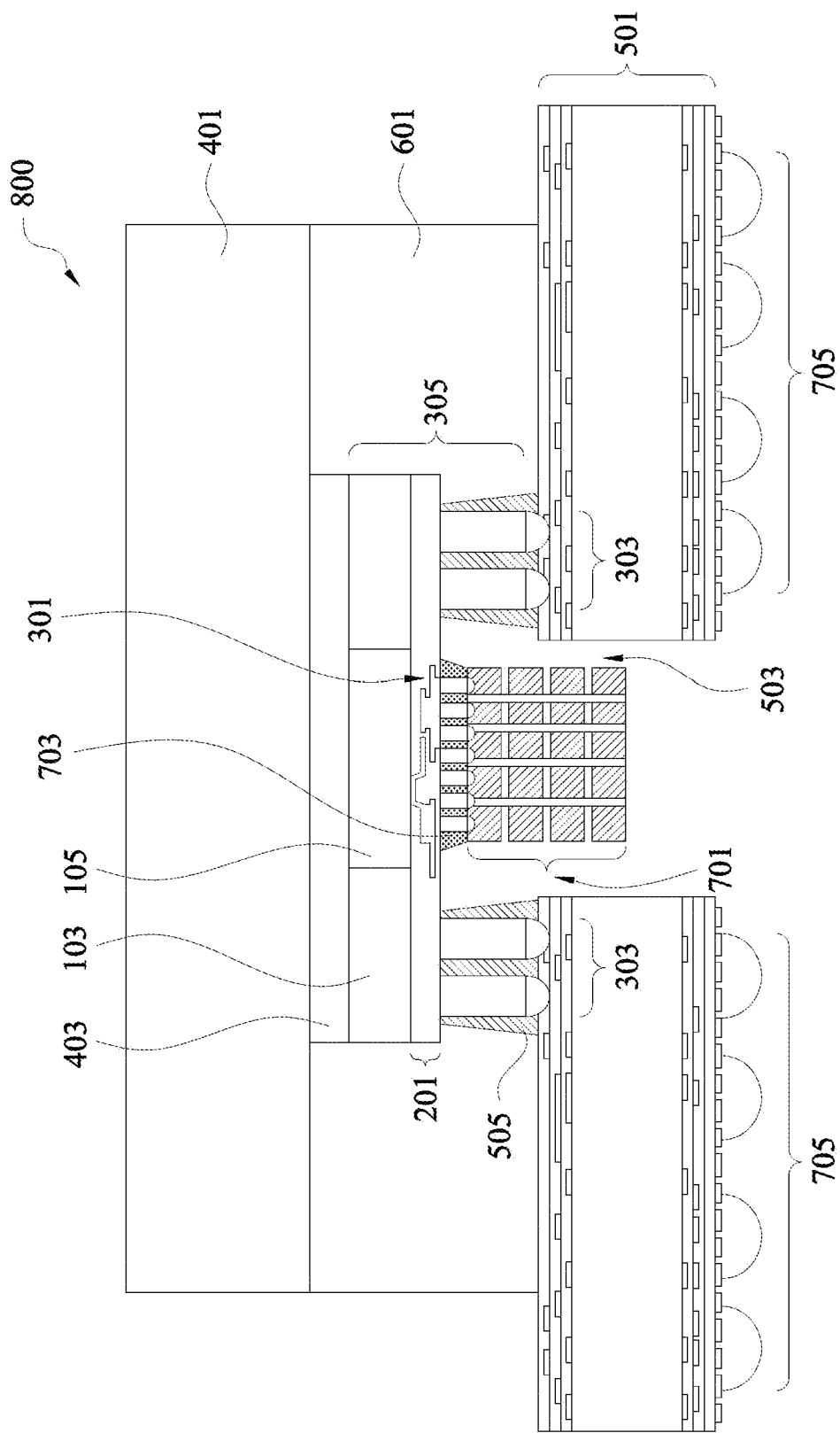
FIG. 8 is a cross-sectional view of an integrated circuit package in accordance with some alternative embodiments.

FIG. 8 is a cross-sectional view of a package 800 in accordance with some embodiments. In the illustrated embodiment, the package 800 is formed using a method similar to that described above with reference to FIGS. 1-7 and the description is not repeated herein. The HDF 401 of the package 800 has a larger width than the semiconductor device 305 and extends above the second encapsulant 601.

Figure 9:
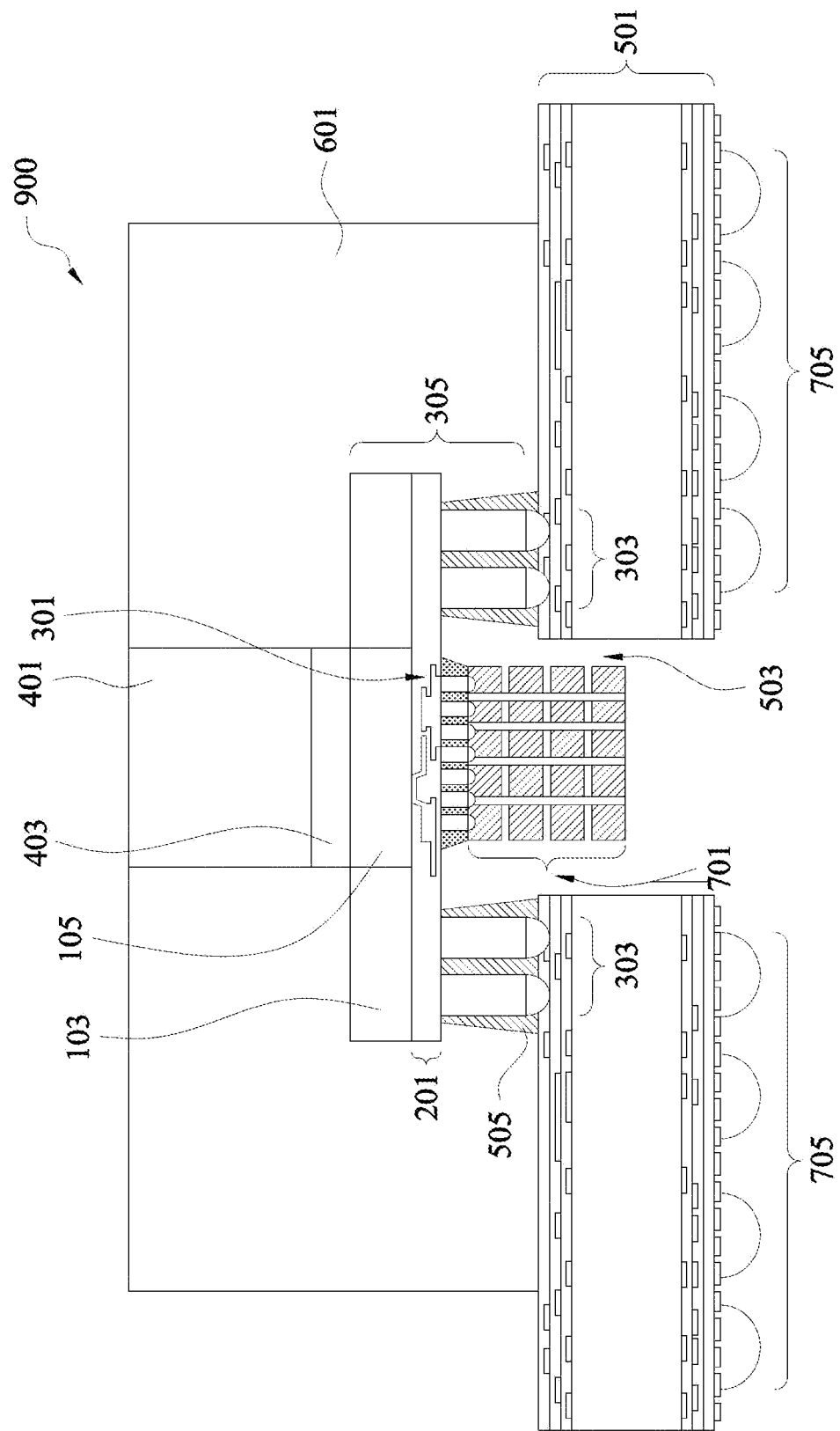
FIG. 9 is a cross-sectional view of an integrated circuit package in accordance with some alternative embodiments.

FIG. 9 is a cross-sectional view of a package 900 in accordance with some embodiments. In the illustrated embodiment, the package 900 is formed using a method similar to that described above with reference to FIGS. 1-7 and the description is not repeated herein. The HDF 401 of the package 900 has a smaller width than the semiconductor device 305. In some embodiments, the width of the HDF 401 may be substantially similar to a width of the die 105. Furthermore, the second encapsulant 601 extends over the first encapsulant 103.

Figure 10:
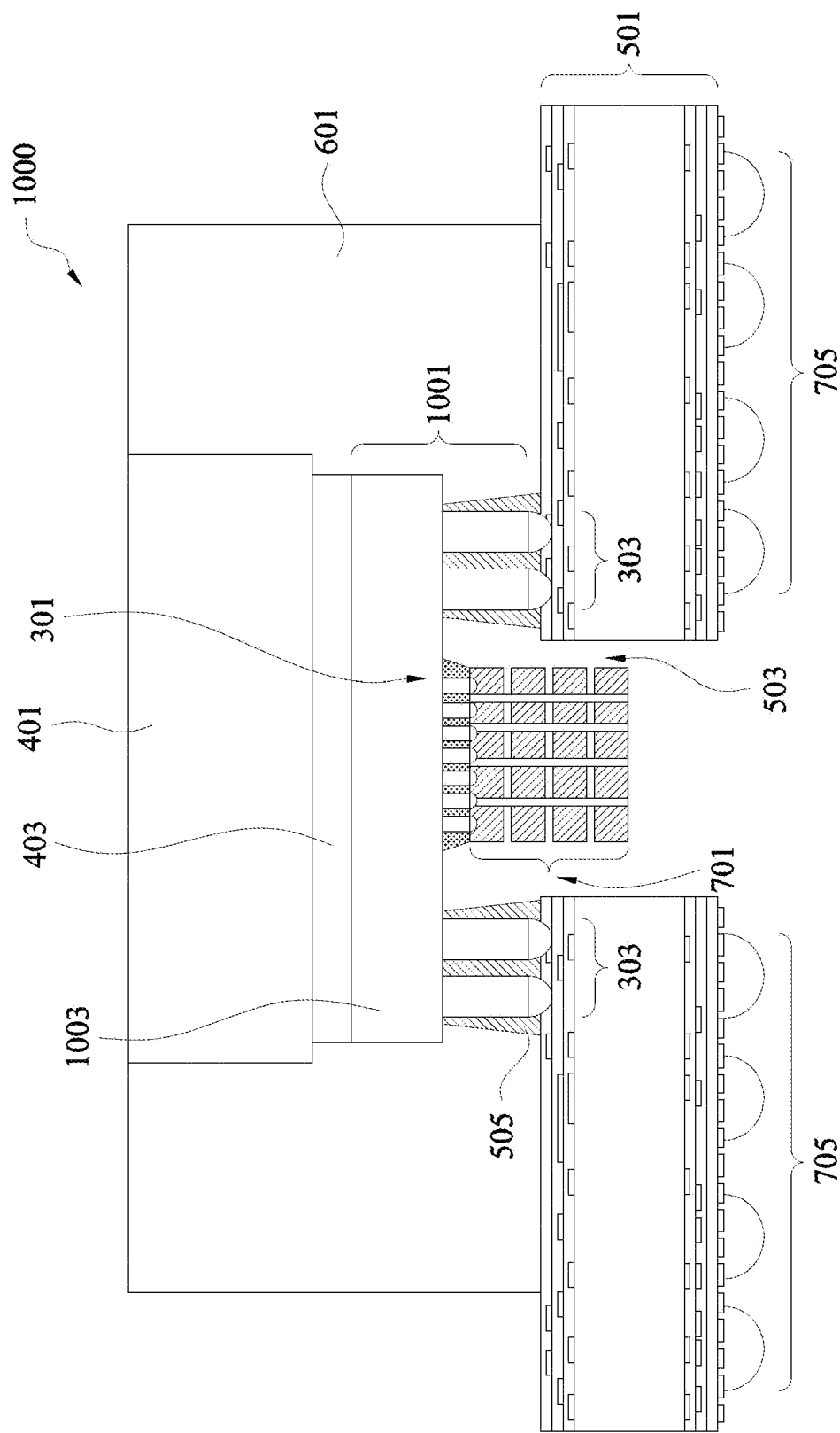
FIG. 10 is a cross-sectional view of an integrated circuit package in accordance with some alternative embodiments.

FIG. 10 is a cross-sectional view of a package 1000 in accordance with some embodiments. In some embodiments, the package 1000 may comprise a semiconductor device 1001, which is formed using a method different from that described above with reference to FIGS. 1-3. In the illustrated embodiment, the semiconductor device 1001 comprises a non-encapsulated die 1003 as shown in FIG. 10. Furthermore, the semiconductor device 1001 does not comprise an encapsulant (such as the first encapsulant 103 of the semiconductor device 305 illustrated, for example, in FIG. 4) and both the first connectors 301 and the second connectors are formed on the non-encapsulated die 1003.

As described above in greater detail with reference to FIGS. 4-7, the HDF 401 is attached to the semiconductor device 305 before mounting the semiconductor device 305 on the package substrate 501 (see FIG. 4), and the die stack 701 is bonded to the semiconductor device 305 after mounting the semiconductor device 305 (with the HDF 401) on the package substrate 501 (see FIG. 7). In other embodiments, packages (such as the packages 400, 800, 900 and 1000) may be formed using other methods, wherein the order or process steps is different from that described above with reference to FIGS. 4-7.

FIGS. 11-14 are cross-sectional views of various processing steps during fabrication of a package in accordance with some alternative embodiments. In some embodiments, packages (such as a package 1200 illustrated in FIG. 14) may be formed using methods with the order of process steps different from that described above with reference to FIGS. 4-7. As described below in greater detail, the die stack 701 is bonded to the semiconductor device 305 before mounting the semiconductor device 305 on the package substrate 501, and the HDF 401 is attached to the semiconductor device 305 after mounting the semiconductor device 305 (with the die stack 701) on the package substrate 501, which are different from process steps described above with reference to FIGS. 4-7.

Figure 11:
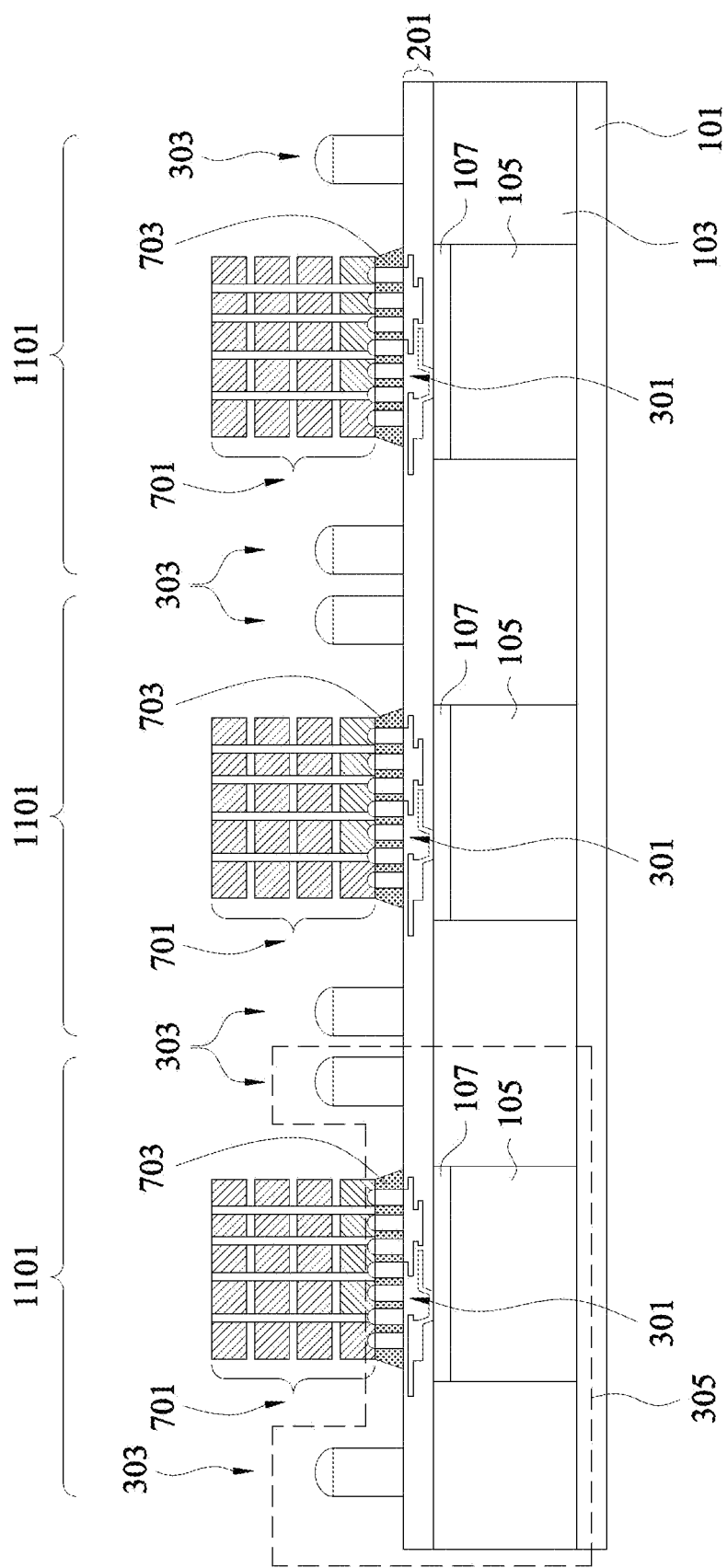
FIGS. 11-14 are cross-sectional views of various processing steps during fabrication of an integrated circuit package in accordance with some alternative embodiments.

Turning first to FIG. 11, the die stacks 701 are bonded to a semiconductor structure of FIG. 3 using the first connectors 301 to form stacked semiconductor devices 1101, such that the die stacks 701 are bonded to the corresponding semiconductor devices 305. A reflow may be performed on the first connectors 301 to bond the semiconductor devices 305 to the corresponding die stacks 701. Subsequently, the second underfill 703 may be dispensed between the semiconductor devices 305 and the corresponding die stacks 701 around the first connectors 301. After dispensing the second underfill 703, a cure process may be also performed.

Figure 12:
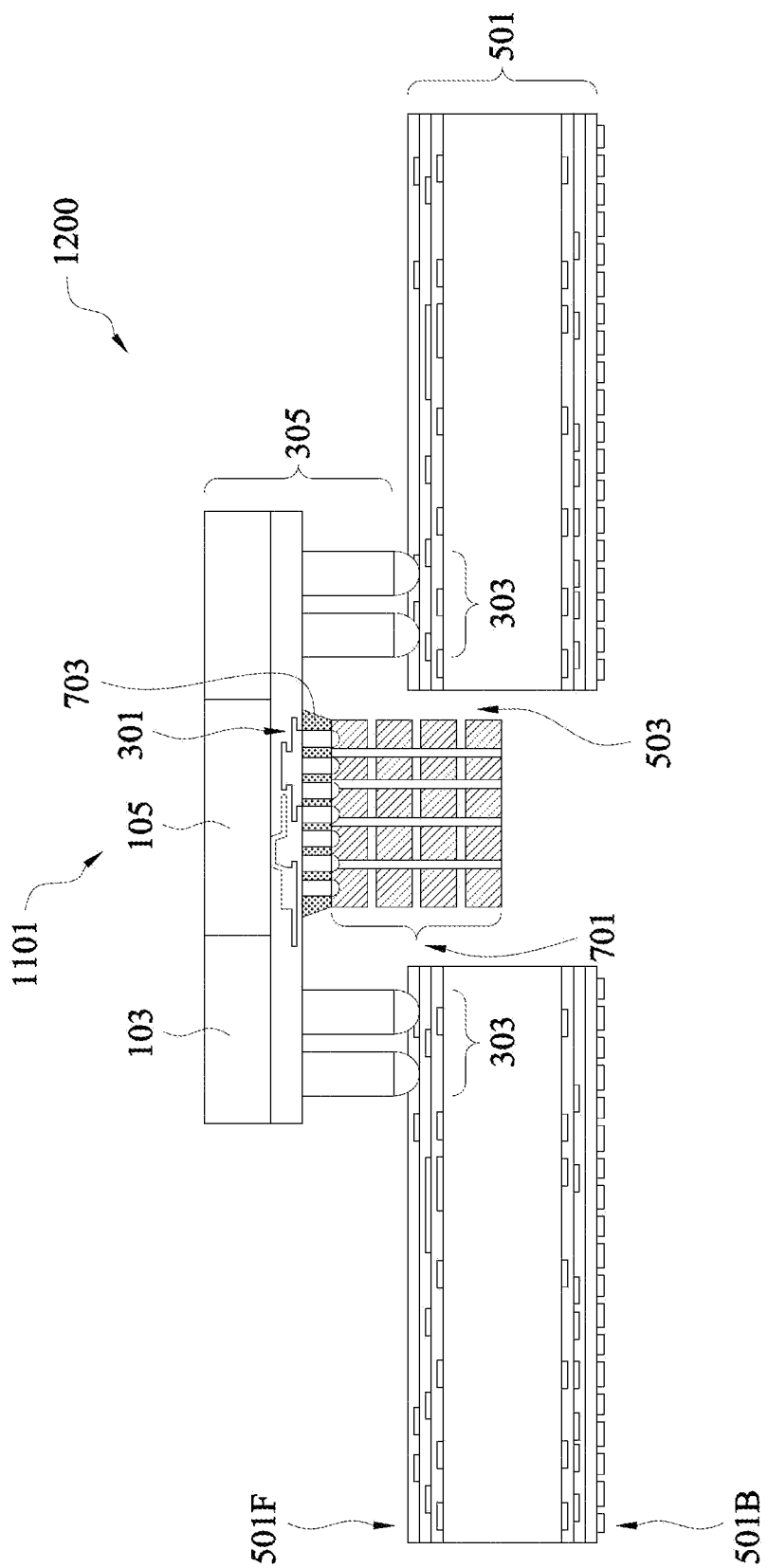

Subsequently, the stacked semiconductor devices 1101 are singulated by sawing, laser ablation, or the like. As described below in greater detail, the stacked semiconductor devices 1101 are further processed to form packages. Referring to FIG. 12, the stacked semiconductor device 1101 is mounted on the front side 501F of the package substrate 501 using the second connectors 303 to form a package 1200. A reflow may be performed on the second connectors 303 to bond the stacked semiconductor device 1101 to the package substrate 501.

In other embodiments, the stacked semiconductor devices 1101 are formed by singulating the semiconductor devices 305 as described above with reference to FIG. 3, and subsequently attaching the die stacks 701 to the singulated semiconductor devices 305.

Figure 13:
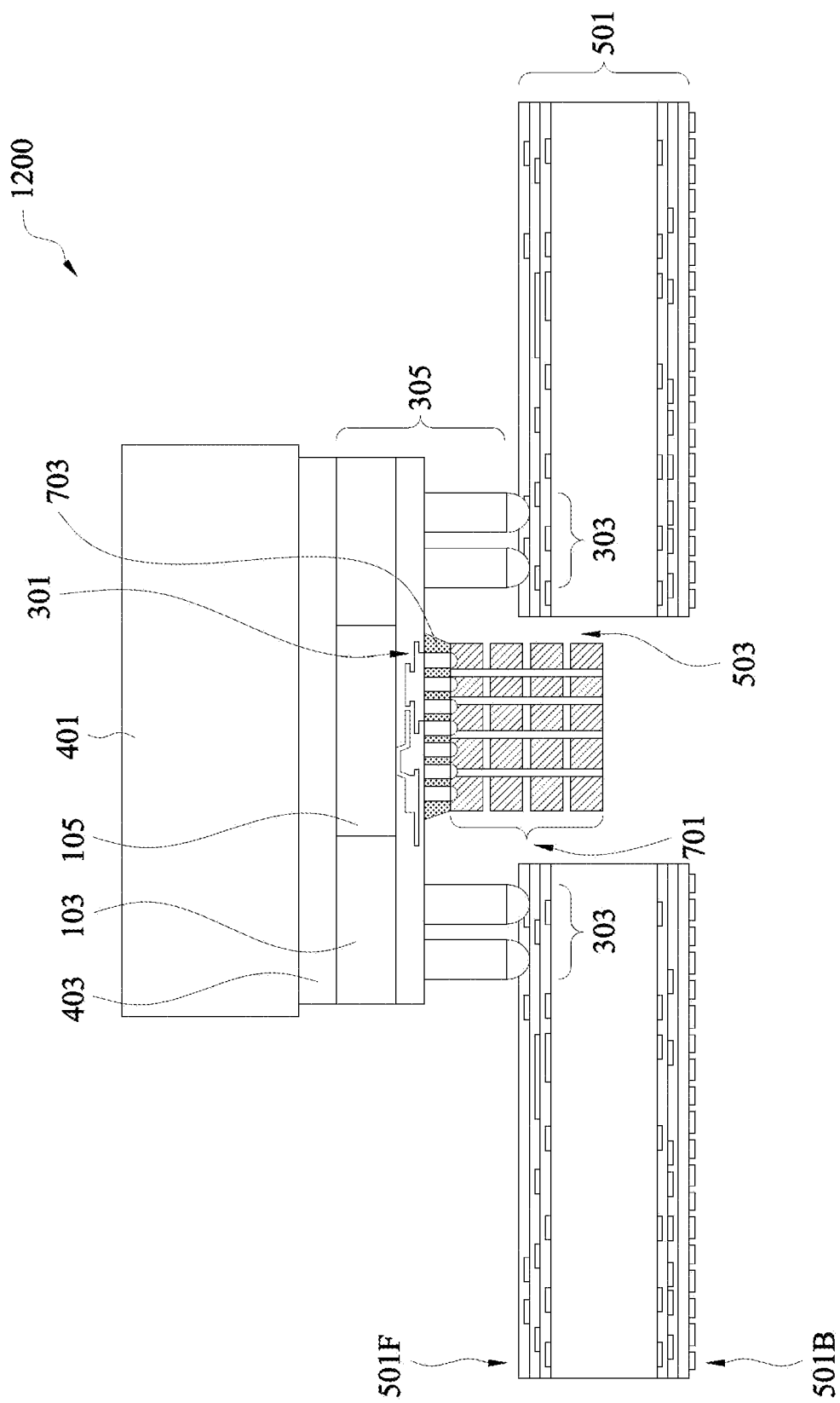

Referring to FIG. 13, the HDF 401 is attached to the semiconductor device 305 using the interface layer 403. In some embodiments, the die stack 701 may be disposed, at least partially, in the through hole 503. Thus, the package 1200 may advantageously have a relatively small form factor and higher bandwidth. Furthermore, the die stack 701 may be electrically connected to the package substrate 501 through the RDLs 201, the first connectors 301 and the second connectors 303. In addition, by not attaching the HDF 401 to the package substrate 501 directly, warping of the package 1200 due to mismatch of the coefficient of thermal expansion between the HDF 401 and the package substrate 501 may be reduced or eliminated. Accordingly, adverse effects (e.g., joint failure between the die stack 701 and the first connectors 301) caused by package warping may be reduced or eliminated. In addition, encapsulating the package 1200 by the second encapsulant 601 may further reduce or eliminate the adverse effects caused by package warping.

Figure 14:
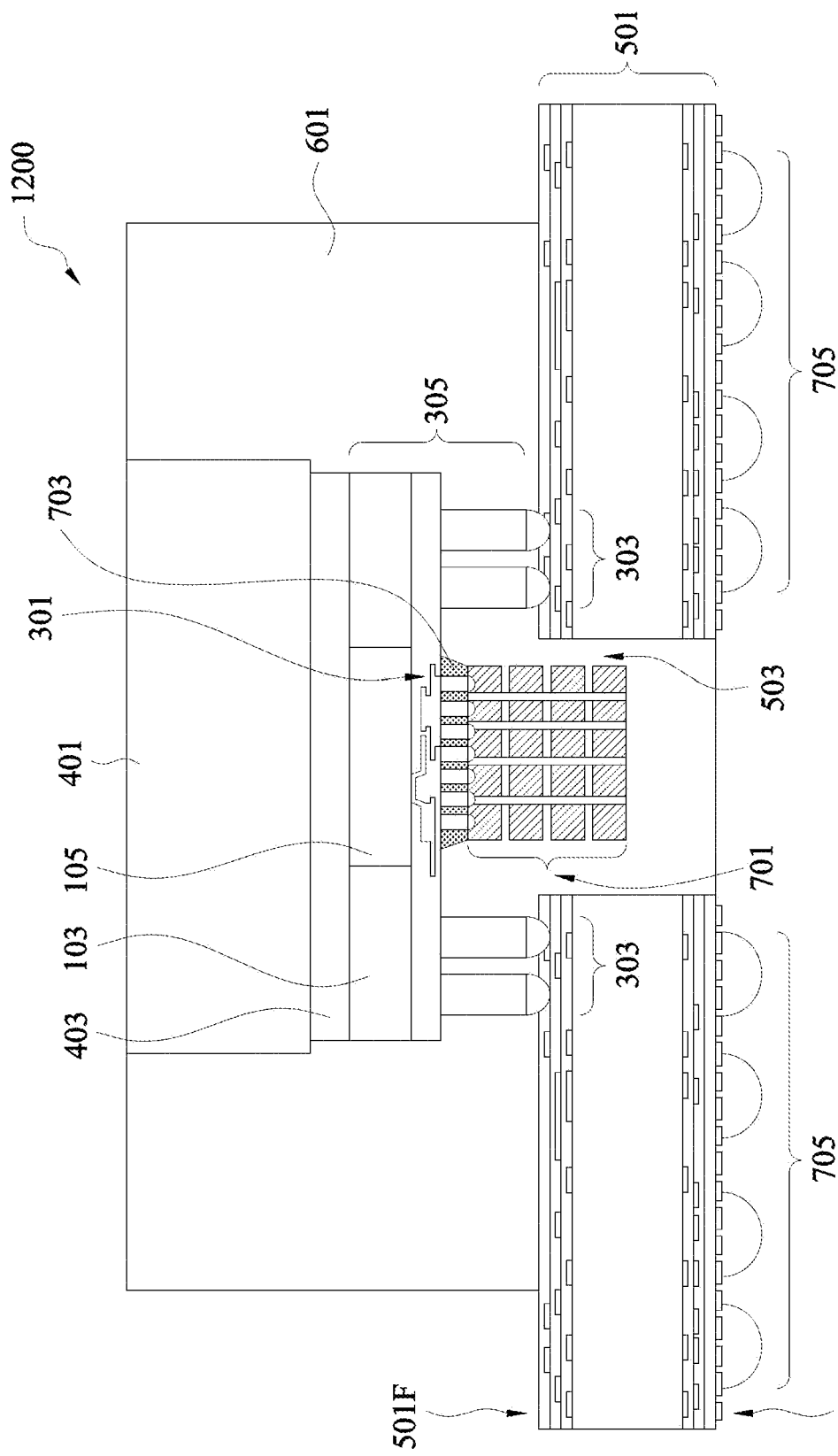

Referring to FIG. 14, the second encapsulant 601 is formed over the package substrate 501 around the semiconductor device 305 and the HDF 401. In some embodiments, a material of the second encapsulant 601 is dispensed over the package substrate 501 and the HDF 401 around the semiconductor device 305. In the illustrated embodiment, the material of the second encapsulant 601 penetrates through voids between the second connectors 303, fills the through hole 503 and surrounds the die stack 701. In some embodiments, a curing may also be performed to harden the material of the second encapsulant 601. In some embodiments, portions of the second encapsulant 601 extending over the HDF 401 may be removed to expose a top surface the HDF 401. The portions of the second encapsulant 601 may be removed using, for example, a CMP process, a grinding process, an etch process, or another suitable thinning process.

Referring further to FIG. 14, after forming the second encapsulant 601, a marking process (e.g., laser marking) may be performed to mark the package 1200. Furthermore, third connectors 705 (e.g., ball grid array (BGA) balls) are formed on the back side 501B of the package substrate 501 to complete formation of the package 1200. In some embodiments, the third connectors 705 may be used to electrically connect the package 1200 to a motherboard (not shown) such as a PCB or another device component of an electrical system.

Figure 15:
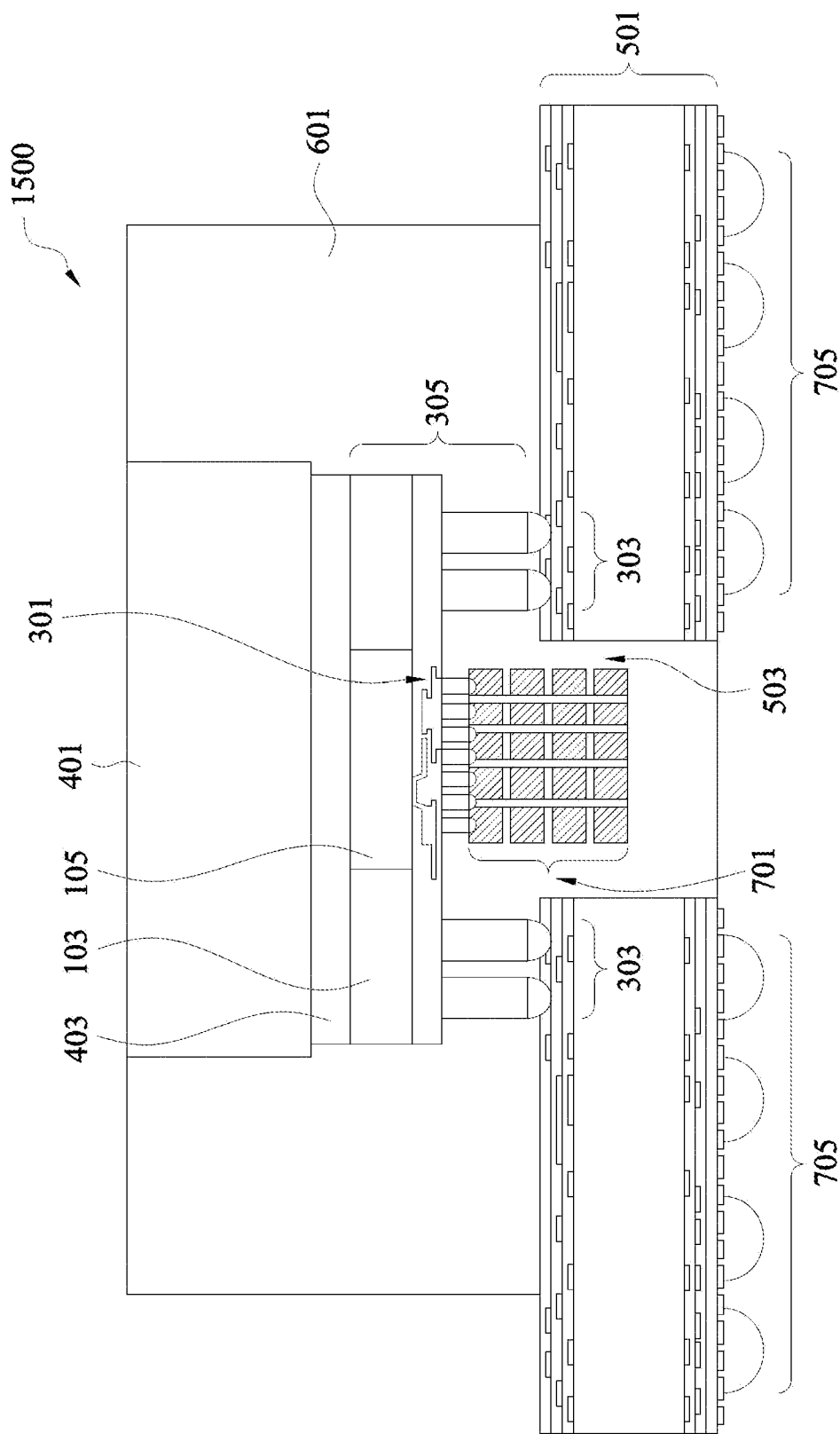
FIG. 15 is a cross-sectional view of an integrated circuit package in accordance with some alternative embodiments.

FIG. 15 is a cross-sectional view of a package 1500 in accordance with some alternative embodiments. In the illustrated embodiment, the package 1500 is formed using a method similar to that described above with reference to FIGS. 11-14 and the description is not repeated herein. After bonding the die stacks 701 to the semiconductor devices 305 using the first connectors 301 as described above with reference to FIG. 11, an underfill (such as the second underfill 703) is not dispersed to fill voids between the first connectors 301. Accordingly, the second encapsulant 601 fills the voids between the first connectors 301 and the voids between the second connectors 303 as illustrated in FIG. 15.

Figure 16:
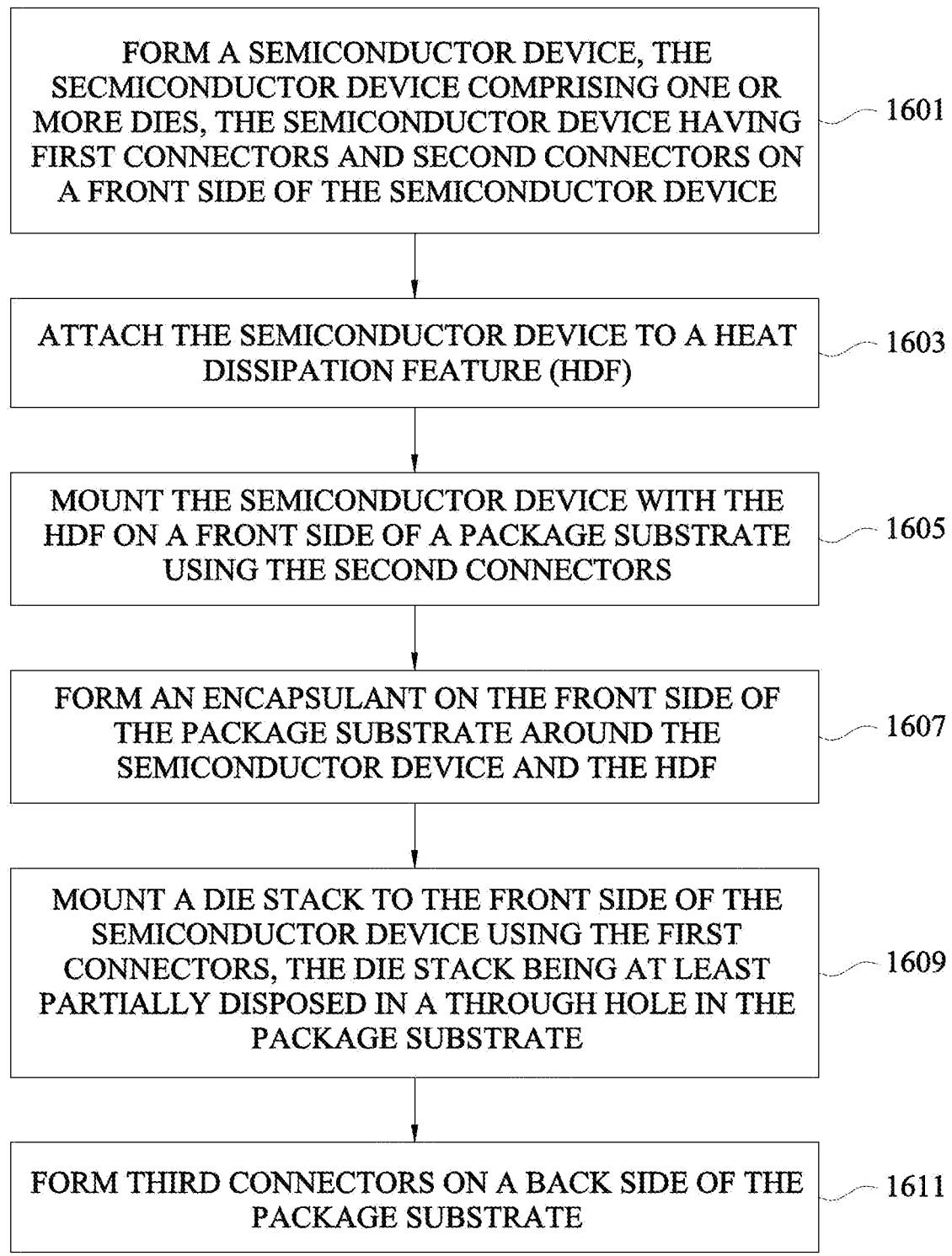
FIG. 16 is a flow diagram illustrating a method of forming an integrated circuit package in accordance with some embodiments.

FIG. 16 is a flow diagram illustrating a method of forming an integrated circuit package in accordance with some embodiments. The method starts with step 1601, wherein a semiconductor device (such as the semiconductor device 305 illustrated in FIG. 3) is formed as described above with reference to FIGS. 1-3. In some embodiments, the semiconductor device comprises one or more integrated circuit dies (such as the die 105) and has first connectors (such as the first connectors 301) and the second connectors (such as the second connectors 303) on a top surface of the semiconductor device as described above with reference to FIG. 3. The method continues to step 1603, wherein the semiconductor device is attached to a HDF (such as the HDF 401) using an interface layer (such as the interface layer 403) as described above in reference to FIG. 4.

At step 1605, the semiconductor device with the attached HDF is mounted on a front side of a package substrate (such as the package substrate 501) using the second connectors as described above with reference to FIG. 5. Subsequently, an underfill (such as the first underfill 505) is dispensed between the semiconductor device and the package substrate around the second connectors as described above with reference to FIG. 5. At step 1607, an encapsulant (such as the second encapsulant 601) is formed on the front side of the package substrate around the semiconductor device and the HDF as described above with reference to FIG. 6.

At step 1609, a die stack (such as the die stack 701) is mounted on the front side of the semiconductor device using the first connectors as described above with reference to FIG. 7. Subsequently, an underfill (such as the second underfill 703) is dispensed between the semiconductor device and the die stack around the first connectors. In some embodiments, the die stack is at least partially disposed in a through hole (such as the through hole 503) formed in the package substrate as described above with reference to FIG. 7. Finally, at step 1611, third connectors (such as the third connectors 705) are formed on a back side of the package substrate as described above with reference to FIG. 7.

Figure 17:
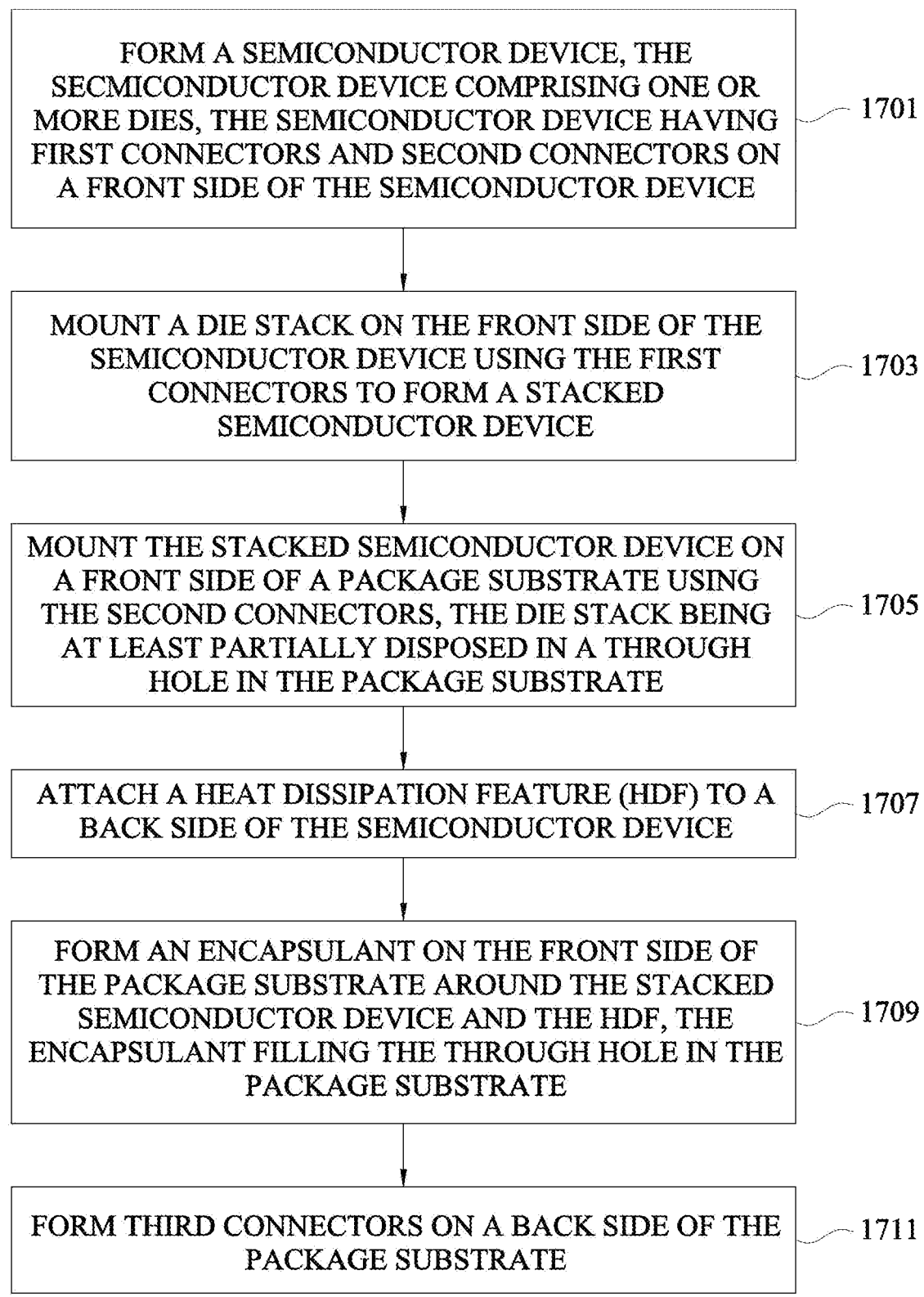
FIG. 17 is a flow diagram illustrating a method of forming an integrated circuit package in accordance with some alternative embodiments.

FIG. 17 is a flow diagram illustrating a method of forming an integrated circuit package in accordance with some alternative embodiments. The method starts with step 1701, wherein a semiconductor device (such as the semiconductor device 305 illustrated in FIG. 3) is formed as described above with reference to FIGS. 1-3. In some embodiments, the semiconductor device comprises one or more integrated circuit dies (such as the die 105) and has first connectors (such as the first connectors 301) and the second connectors (such as the second connectors 303) on a top surface of the semiconductor device as described above with reference to FIG. 3. The method continues to step 1703, wherein a die stack (such as the die stack 701) is mounted on the front side of the semiconductor device using the first connectors to form a stacked semiconductor device (such as the stacked semiconductor device 1101) as described above with reference to FIG. 11. Subsequently, an optional underfill (such as the second underfill 703) is dispensed between the semiconductor device and the die stack around the first connectors as described above with reference to FIG. 11.

At step 1705, the stacked semiconductor device is is mounted on a front side of a package substrate (such as the package substrate 501) using the second connectors as described above with reference to FIG. 12. In some embodiments, the die stack is at least partially disposed in a through hole (such as the through hole 503) formed in the package substrate as described above with reference to FIG. 12. At step 1707, an HDF (such as the HDF 401) is attached to a back side of the semiconductor device using an interface layer (such as the interface layer 403) as described above in reference to FIG. 13.

At step 1709, an encapsulant (such as the second encapsulant 601) is formed on the front side of the package substrate around the stacked semiconductor device and the HDF, wherein the encapsulant fills the through hole in the package substrate as described above with reference to FIG. 14. Finally, at step 1711, third connectors (such as the third connectors 705) are formed on a back side of the package substrate as described above with reference to FIG. 14.

Various packages described above with reference to various illustrative embodiments may advantageously have relatively small form factors, since some of the packaged dies may be disposed in through holes formed in package substrates. Furthermore, by not attaching heat dissipation feature directly to package substrates, warping of the packages due to mismatch of the coefficient of thermal expansion between the heat dissipation features and the corresponding package substrates may be reduced or eliminated. Accordingly, adverse effects (e.g., joint failure between the packaged dies and corresponding connectors) caused by package warping may be reduced or eliminated. In addition, encapsulating the packages by encapsulants may further reduce or eliminate adverse effects caused by package warping.

According to an embodiment, a method comprises attaching a workpiece to a heat dissipation feature, and mounting the workpiece on a first side of a package substrate, the package substrate comprising a through hole, wherein the heat dissipation feature is not directly attached to the package substrate. The method further comprises forming a first encapsulant on the first side of the package substrate, wherein the first encapsulant surrounds the workpiece, and mounting a die stack to the workpiece, the die stack comprising one or more integrated circuit dies, wherein the die stack is at least partially disposed in the through hole of the package substrate.

According to another embodiment, a method comprises bonding a die stack to a workpiece, the die stack comprising one or more integrated circuit dies, and mounting the workpiece on a first side of a package substrate, the package substrate comprising a through hole, wherein the die stack is at least partially disposed in the through hole of the package substrate. The method further comprises attaching a heat dissipation feature to the workpiece, the workpiece being interposed between the heat dissipation feature and the die stack, wherein the heat dissipation feature is completely separated from the package substrate, and forming a first encapsulant on the first side of the package substrate, wherein the first encapsulant extends along sidewalls of the workpiece.

According to yet another embodiment, a semiconductor device comprises a package substrate, the package substrate having a through hole therein, a workpiece bonded to the package substrate, and a die stack bonded to the workpiece, the die stack comprising one or more integrated circuit dies, wherein the die stack is at least partially disposed in the through hole of the package substrate. The semiconductor device further comprises a heat dissipation feature attached to the workpiece, the workpiece being interposed between the heat dissipation feature and the die stack, wherein the heat dissipation feature is completely separated from the package substrate, and a first encapsulant on the package substrate, wherein the first encapsulant extends along sidewalls of the workpiece.

According to another embodiment, a method includes bonding a die stack to a workpiece, the die stack including one or more integrated circuit dies. The method includes mounting the workpiece on a first side of a package substrate, the package substrate including a through hole, where the die stack is at least partially disposed in the through hole of the package substrate. The method also includes attaching a heat dissipation feature to the workpiece, the workpiece being interposed between the heat dissipation feature and the die stack, where the heat dissipation feature is completely separated from the package substrate. The method further includes forming a first encapsulant on the first side of the package substrate, where the first encapsulant extends along sidewalls of the workpiece.

According to yet another embodiment, a method includes forming a semiconductor device, the semiconductor device including one or more dies. The method includes forming first connectors and second connectors on a first side of the semiconductor device. The method further includes mounting a second die to the first connectors on the first side of the semiconductor device. The method also includes mounting the semiconductor device to a front side of a package substrate by the second connectors, the second die being at least partially disposed in a cavity of the package substrate. The method further includes attaching a heat dissipation feature to a second side of the semiconductor device, the second side being at an opposite surface from the first side.

According to a further embodiment, a method includes forming a workpiece by a process including attaching a die to a carrier substrate, forming redistribution structure over the die, the redistribution structure including one or more redistribution layers, the redistribution structure electrically coupled to the die, forming first connectors and second connectors coupled to the redistribution structure, and mounting a second die to the first connectors. The method includes singulating the workpiece to form a first semiconductor device. The method further includes bonding the second connectors of the first semiconductor device to a front side of a package substrate, the second die being at least partially disposed in a through hole of the package substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
bonding a die stack to a workpiece, the die stack comprising one or more integrated circuit dies;
after bonding the die stack to the workpiece, mounting the workpiece on a first side of a package substrate, the package substrate comprising a through hole, wherein the die stack is at least partially disposed in the through hole of the package substrate;
after mounting the workpiece to the package substrate, attaching a heat dissipation feature to the workpiece, the workpiece being interposed between the heat dissipation feature and the die stack, wherein the heat dissipation feature is completely separated from the package substrate; and
after attaching the heat dissipation feature, forming a first encapsulant on the first side of the package substrate, the first encapsulant having a lateral extent less than a lateral extent of the package substrate, wherein the first encapsulant extends over the heat dissipation feature, wherein the first encapsulant contacts sidewalls of the heat dissipation feature and extends along sidewalls of the heat dissipation feature, and wherein the first encapsulant contacts sidewalls of the workpiece and extends along sidewalls of the workpiece; and removing a portion of the first encapsulant over the heat dissipation feature to expose a surface of the heat dissipation feature.

2. The method of claim 1, wherein the workpiece is an integrated circuit die, the first encapsulant extending along sidewalls of the integrated circuit die.

3. The method of claim 1, wherein the workpiece comprises an integrated circuit die encapsulated by a second encapsulant, the second encapsulant being interposed between the integrated circuit die and the first encapsulant.

4. The method of claim 1, wherein after attaching the heat dissipation feature, the heat dissipation feature has sidewalls that extend further than the workpiece, overhanging an edge of the workpiece, wherein a thermal interface material is interposed between the workpiece and the heat dissipation feature.

5. The method of claim 1, wherein a portion of the first encapsulant is interposed between the workpiece and the die stack.

6. The method of claim 1, wherein the first encapsulant fills the through hole of the package substrate.

7. A method comprising:
forming a semiconductor device, the semiconductor device comprising one or more dies;
forming first connectors and second connectors on a first side of the semiconductor device, wherein forming each of the second connectors comprises plating a conductive column on the first side of the semiconductor device and depositing a solder material on the conductive column, the conductive column extending further from the first side of the semiconductor device than the first connectors;
mounting a second die to the first connectors on the first side of the semiconductor device, wherein following mounting the second die, each of the conductive columns of the second connectors overlap sidewalls of the second die;
after mounting the second die to the first connectors, mounting the semiconductor device to a front side of a package substrate by the second connectors, the second die being at least partially disposed in a cavity of the package substrate;
after mounting the semiconductor device to the package substrate, attaching a heat dissipation feature to a surface of a second side of the semiconductor device, the heat dissipation feature extending laterally further than the semiconductor device, the second side being at an opposite surface from the first side;
forming a second encapsulant on the front side of the package substrate, the second encapsulant surrounding the second connectors, wherein the second encapsulant surrounds the heat dissipation feature, the second encapsulant having a first lateral extent, the package substrate having a second lateral extent, the first lateral extent less than the second lateral extent; and
removing a portion of the second encapsulant over the heat dissipation feature to expose a surface of the heat dissipation feature.

8. The method of claim 7, further comprising:
forming a first encapsulant between the second die and the semiconductor device, the first encapsulant surrounding the first connectors.

9. The method of claim 7, wherein the second encapsulant surrounds the second die and at least partially fills the cavity of the package substrate.

10. The method of claim 7, further comprising:
forming third connectors on a back side of the package substrate, the back side being opposite the front side.

11. The method of claim 7, wherein the cavity is a through hole.

12. The method of claim 11, further comprising:
forming a second encapsulant on the front side of the package substrate, the second encapsulant surrounding the second connectors and the second die, the second encapsulant filling the through hole and having a bottom surface which is level with a back side of the package substrate.

13. The method of claim 7, wherein the heat dissipation feature is attached to the semiconductor device by a thermal interface material.

14. A method comprising:
forming a workpiece by a process comprising:
attaching a die to a carrier substrate,
forming redistribution structure over the die, the redistribution structure comprising one or more redistribution layers, the redistribution structure electrically coupled to the die,
forming first connectors coupled to the redistribution structure and second connectors coupled to the redistribution structure, and
mounting a second die to the first connectors;
singulating the workpiece to form a first semiconductor device, a back side of the die being exposed;
after forming the first semiconductor device, bonding the second connectors of the first semiconductor device to a front side of a package substrate, the second die being at least partially disposed in a through hole of the package substrate;
after bonding the second connectors of the first semiconductor device to the package substrate, attaching a heat dissipation feature to the first semiconductor device, the heat dissipation feature extending laterally further than lateral extents of the first semiconductor device, sidewalls of the first semiconductor device being exposed from the heat dissipation feature; and
after attaching the heat dissipation feature, depositing a first encapsulant laterally surrounding the heat dissipation feature and the first semiconductor device.

15. The method of claim 14, further comprising:
disposing a second encapsulant surrounding the first connectors.

16. The method of claim 14, further comprising:
disposing the first encapsulant around the second connectors and a die stack, the die stack including the second die.

17. The method of claim 16, wherein the first encapsulant surrounds each of the first connectors.

18. The method of claim 16, further comprising:
disposing the first encapsulant over the heat dissipation feature, between the first semiconductor device and the package substrate, and in the through hole of the package substrate; and
thinning the first encapsulant to expose the heat dissipation feature.

19. The method of claim 14, wherein the heat dissipation feature is attached directly to the back side of the die by a thermal interface material, wherein the first encapsulant has a first lateral extent, wherein the package substrate has a second lateral extent, and wherein the first lateral extent is less than the second lateral extent.

20. The method of claim 14, wherein the second die is a memory cube.

\* \* \* \* \*